US006476669B2

(12) United States Patent
McClure et al.

(10) Patent No.: US 6,476,669 B2
(45) Date of Patent: Nov. 5, 2002

(54) REFERENCE VOLTAGE ADJUSTMENT

(75) Inventors: David C. McClure, Carrollton; Rong Yin, Coppell, both of TX (US)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 09/902,206

(22) Filed: Jul. 10, 2001

(65) Prior Publication Data

US 2002/0030526 A1 Mar. 14, 2002

Related U.S. Application Data

(62) Division of application No. 09/476,036, filed on Dec. 31, 1999, now Pat. No. 6,281,734.

(51) Int. Cl.[7] .................................. H03K 17/72
(52) U.S. Cl. .................................. 327/543
(58) Field of Search .................................. 327/538, 540, 327/541, 543, 545, 546

(56) References Cited

U.S. PATENT DOCUMENTS

| | | | |
|---|---|---|---|
| 5,627,493 A | 5/1997 | Takeuchi et al. | 327/546 |
| 5,781,043 A * | 7/1998 | Slemmer | 327/361 |
| 6,229,376 B1 * | 5/2001 | Geysen | 327/355 |

* cited by examiner

*Primary Examiner*—Jeffrey Zweizig
(74) *Attorney, Agent, or Firm*—Lisa K. Jorgenson; William A. Munck

(57) ABSTRACT

A reference voltage trim circuit includes a voltage follower receiving the reference voltage to be trimmed, with one or more resistive loads providing predefined voltage shifts serially connected between the output of the voltage follower and the output of the trim circuit. The voltage follower includes a current mirror differential amplifier receiving the reference voltage at one input and the output of the voltage follower at the other input, and a transistor with a resistive load connected between the power supply voltages and receiving the output of the current mirror differential amplifier at the transistor's gate. The resistive loads provide varying preselected voltage drop and are each shunted by corresponding fuses, with the entire series of resistive loads shunted by a master fuse. To trim the reference voltage, at least the master fuse is blown, together with the fuse(s) shunting resistive loads which combine to result in the desired trim voltage. Pass gates control which end of the resistive load series is connected to the output of the voltage follower and which is connected to the output of the trim circuit. To decrement the reference voltage, a first end is connected to the output of the voltage follower and the second end is connected to trim circuit output; to increment the reference voltage, the second end of the resistive load series is connected to the voltage follower output and the first end is connected to the trim circuit output.

20 Claims, 3 Drawing Sheets

REFERENCE VOLTAGE ADJUSTMENT

This application is a division of prior U.S. application Ser. No. 09/476,036 filed on Dec. 31, 1999, now U.S. Pat. No. 6,281,734.

BACKGROUND OF THE INVENTION

1. Field of the Invention

The present invention relates to integrate circuits, and particularly to reference voltages within integrated circuits. Still more particularly, the present invention relates to adjustment of reference voltages within integrated circuits.

2. Description of the Prior Art

Many integrated circuits are implemented by way of circuits that are controlled by a reference voltage. Therefore, proper circuit operation in modern digital integrated circuits, particularly those fabricated utilizing complementary metal-oxide-semiconductor (CMOS) technology, often depends upon the availability of an accurate, stable reference voltage. For example, many functional circuits internal to an integrated circuit rely upon current sources that conduct a stable current. Examples of such functional circuits include differential amplifiers, current mirrors, operational amplifiers, level shift circuits, and circuits that themselves generate reference voltages. Since current sources are generally implemented as a field effect transistor receiving a reference voltage at its gate, the stability of the current source, and proper operation of the circuit containing the current source, depends upon the accuracy and stability of the reference voltage applied to the gate of the field effect transistor. Other circuits, particularly those that control the switching response of logic circuits within modern integrated circuits, may use a series field effect transistor with its gate controlled by a reference voltage to control the switching speed, or slew rate, of the circuit. The reference voltages used in these circuits is produced by a voltage reference circuit, or bias circuit, that is preferably designed to provide a stable and accurate reference voltage.

Adjustment to a voltage reference value is sometimes required to compensate for processing variations. For example, tight operational tolerances may require trim capability within the circuit to achieve the narrow window of proper operation over variations in silicon processing. Such trim capability generally includes fuses, typically blown with lasers for adjustment of the reference voltage. However, trim capability is difficult to add to some circuits generating reference voltages, particularly where fuse adjustment can cause variations over voltage due to cancellation of terms in the reference voltage output equation which will no longer cancel after fuses are blown.

It would be desirable, therefore, to provide trim up and trim down capability for any reference voltage being utilized, enabling operation within a tightly spaced window.

SUMMARY OF THE INVENTION

A reference voltage trim circuit includes a voltage follower receiving the reference voltage to be trimmed, with one or more resistive loads providing predefined voltage shifts serially connected between the output of the voltage follower and the output of the trim circuit. The voltage follower includes a current mirror differential amplifier receiving the reference voltage at one input and the output of the voltage follower at the other input, and a transistor with a resistive load connected between the power supply voltages and receiving the output of the current mirror differential amplifier at the transistor's gate. The resistive loads provide varying preselected voltage drop and are each shunted by corresponding fuses, with the entire series of resistive loads shunted by a master fuse. To trim the reference voltage, at least the master fuse is blown, together with the fuse(s) shunting resistive loads which combine to result in the desired trim voltage. Pass gates control which end of the resistive load series is connected to the output of the voltage follower and which is connected to the output of the trim circuit. To decrement the reference voltage, a first end is connected to the output of the voltage follower and the second end is connected to trim circuit output; to increment the reference voltage, the second end of the resistive load series is connected to the voltage follower output and the first end is connected to the trim circuit output.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

DETAILED DESCRIPTION

Figure 1:
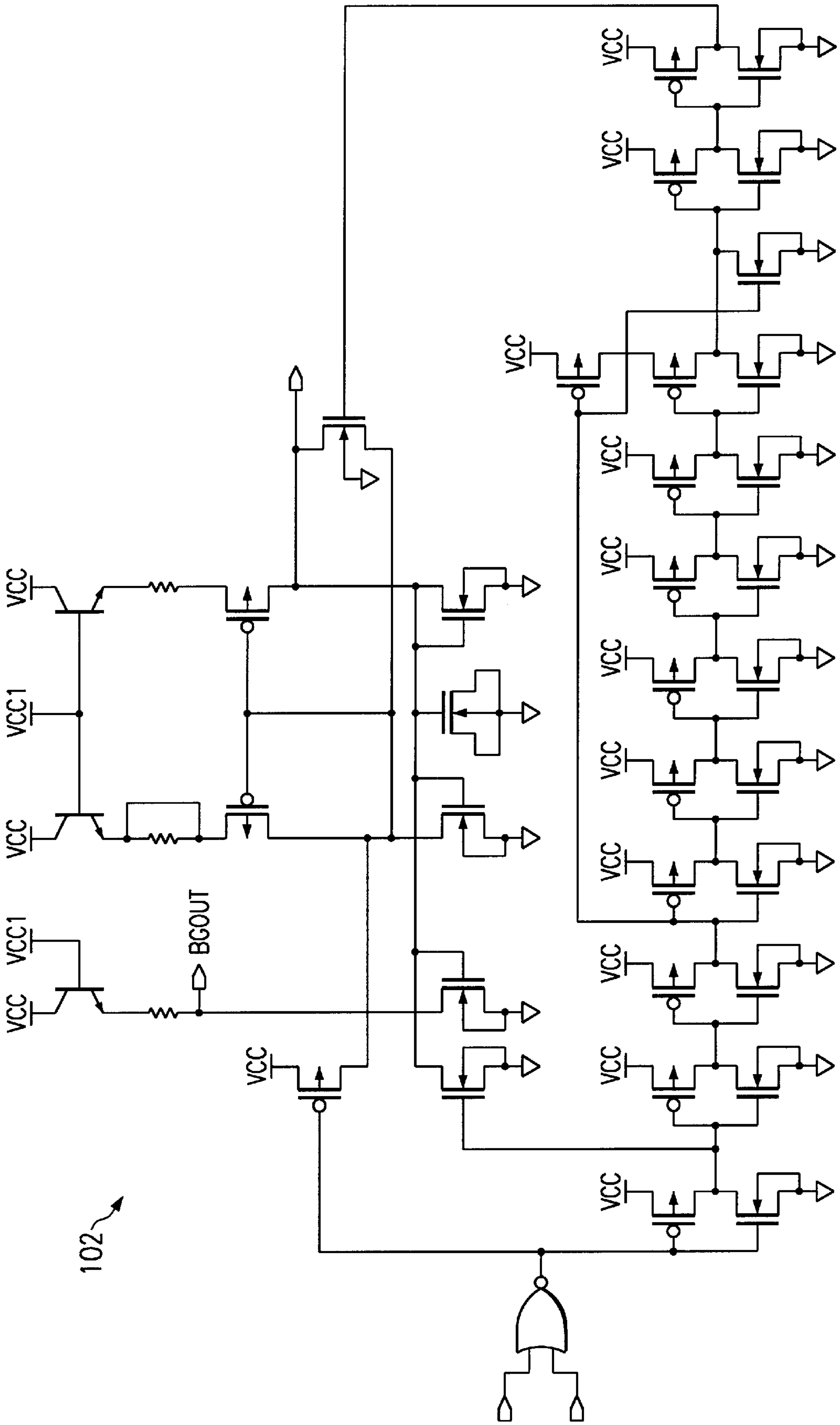
FIGS. 1 and 2 depict circuit diagrams for a reference voltage circuit generating a reference voltage which may be adjusted in accordance with a preferred embodiment of the present invention.
Figure 2:
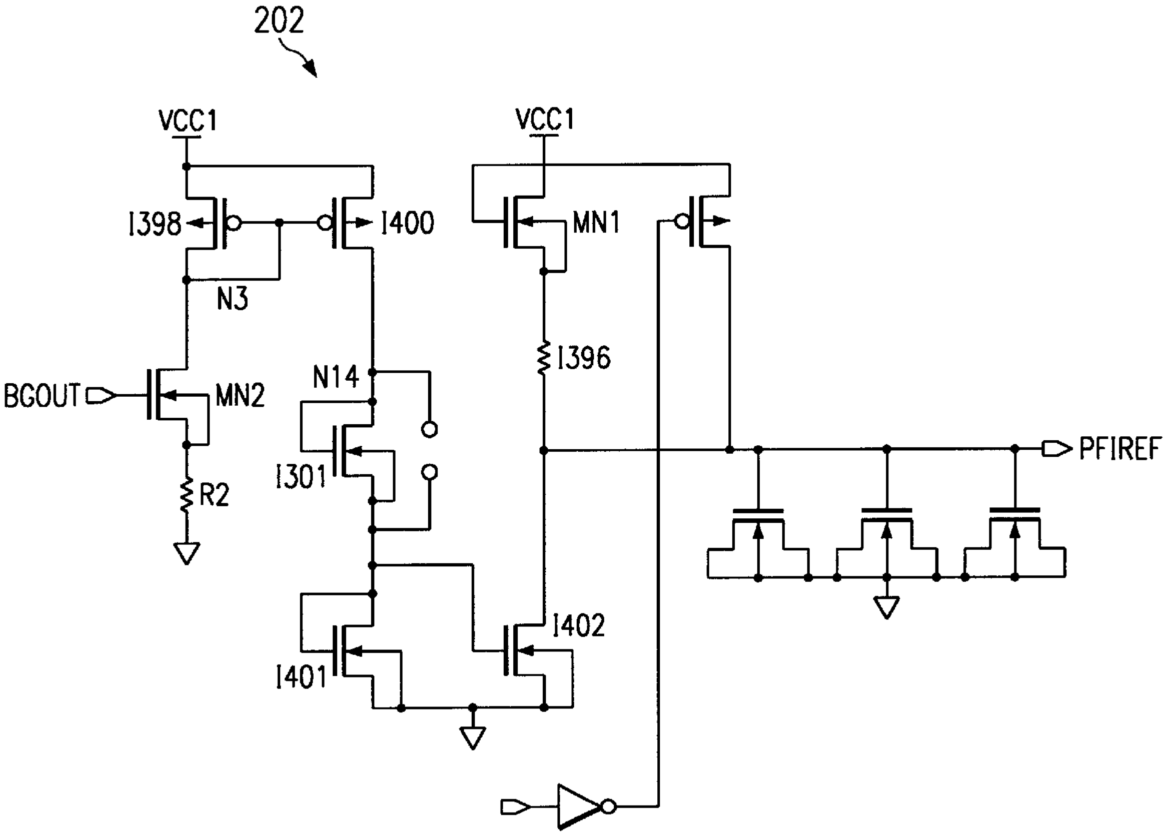

With reference now to the figures, and particularly with reference to FIGS. 1 and 2, circuit diagrams for a reference voltage circuit generating a reference voltage which may be adjusted in accordance with a preferred embodiment of the present invention are depicted. These circuits form part of a Power Failure In, Power Failure Out (PFI/PFO) function within an integrated circuit, in which the PFI input voltage is compared to a reference voltage for the power failure threshold and the PFO output is asserted if the PFI input voltage is less than the power failure threshold. This function is intended for use as an undervoltage detector to signal a failing power supply, allowing the power source for the integrated circuit to be switched to a battery backup.

FIG. 1 depicts a bandgap circuit 102, and is employed in generating the reference voltage PFIREF. The output BGOUT of bandgap circuit 102 is equal to an upper power supply voltage VCC1 minus 1.25 V. For memory based products utilizing an n-type susbtrate, and therefore having vertical n-p-n transistors for the bandgap bipolars, where the n-type material for the collector is the substrate at VCC, the reference is to VCC rather than to VSS. An n-type substrate is preferable for poly-r memory cells due to its greater immunity to alpha particles.

The output BGOUT of bandgap circuit 102 depicted in FIG. 1 is input to a reference voltage circuit 202 depicted in FIG. 2. Reference voltage circuit 202 converts the voltage of BGOUT (VCC1−1.25V) to a reference voltage PFIREF having a voltage of 1.25 V, the required reference voltage value for the PFI/PFO function described above. The current through resistor R2 is the upper power supply voltage VCC1 minus 1.25 volts minus the threshold voltage of n-channel transistor MN2, all divided by the resistance of resistor R2—that is, (VCC1−1.25V−Vt(N2))/R2. This current is mirrored through p-channel transistor I400 via p-channel transistor 1398. An n-channel transistor I301 is employed to create a voltage drop such that the drain voltage of transistor I400 is close to the drain voltage of transistor I398—i.e., the voltage of node N3 is approximately equal to the voltage of node N14, which provides better matching of the currents through transistors I398 and I400.

The current through transistor I400 is mirrored to n-channel transistor I402 via n-channel transistor I401. The output voltage PFIREF taken from the drain of transistor I402 is therefore equal to the upper power supply voltage VCC1 minus the threshold voltage of n-channel mirror transistor MN1 minus the current I through transistor I402 times the resistance R of n-channel transistor I396—that is, VCC1−Vt(MN1)−IR. The current I through transistor I402 should match the current through resistor R2, so that the expression for the output voltage PFIREF may be written as $$VCC1 - Vt(MN1) - R\left(\frac{VCC1 - 1.25V - Vt(MN2)}{R2}\right).$$

If the threshold voltages of mirror transistors MN1 and MN2 are matched, and the resistance of resistor R2 matches the resistance of transistor I396, terms within this expression cancel and the output voltage PFIREF is equal to 1.25 V. Thus, by matching transistors MN1 and MN2 (and particularly their threshold voltages), transistors I398 and I400, transistors I401 and I402, and the currents through and resistances of resistor R2 and resistor I396, a reference voltage value of 1.25 V may be obtained.

In implementation, the body or bulk of mirror transistors MN1 and MN2 are tied to the respective sources so that there is no body effect. Transistors MN1 and MN2 are laid out as a matched pair and resistor R2 is laid out matched with resistor I396. Capacitors may be added for stability of the output voltage PFIREF. However, tests indicate variations of ±100 mV across several lots of the circuits depicted in FIGS. 1 and 2, which, if occurring entirely within the bandgap voltage, results in a variation of ±75 mV at the bandgap output due to the resistor ratios. Simulation of the reference voltage output PFIREF across temperature, voltage, and process corners is shown in Table I:

TABLE I

| Temp (° C.) | VCC (V) | MIN (V) | | NOM (V) | | MAX (V) | |
|---|---|---|---|---|---|---|---|
| 100 | 5.5 | 1.251 | | 1.245 | | 1.237 | |
| 0 | 5.5 | 1.252 | 126 μA | 1.246 | 149 μA | 1.239 | 175 μA |
| 100 | 4.0 | 1.252 | | 1.249 | | 1.246 | |
| 0 | 4.0 | 1.253 | | 1.251 | | 1.248 | |
| 100 | 2.4 | 1.250 | | 1.250 | | 1.249 | |
| 0 | 2.4 | 1.250 | | 1.250 | | 1.250 | |
| 100 | 2.0 | 1.250 | | 1.250 | | 1.250 | |
| 0 | 2.0 | 1.253 | | 1.250 | | 1.250 | |

The variation from 0° C. to 100° C. is 2 mV; the variation over process corners is 14 mV; and the maximum variation from the desired 1.25 V reference voltage is 13 mV. Because the desired output voltage PFIREF is achieved as a result of cancellation of terms within the expression for the output voltage, addition of trim capability to the circuits of FIG. 2 to adjust to the desired 1.25 V within acceptable to tolerances is difficult as it may result is terms no longer canceling.

Figure 3:
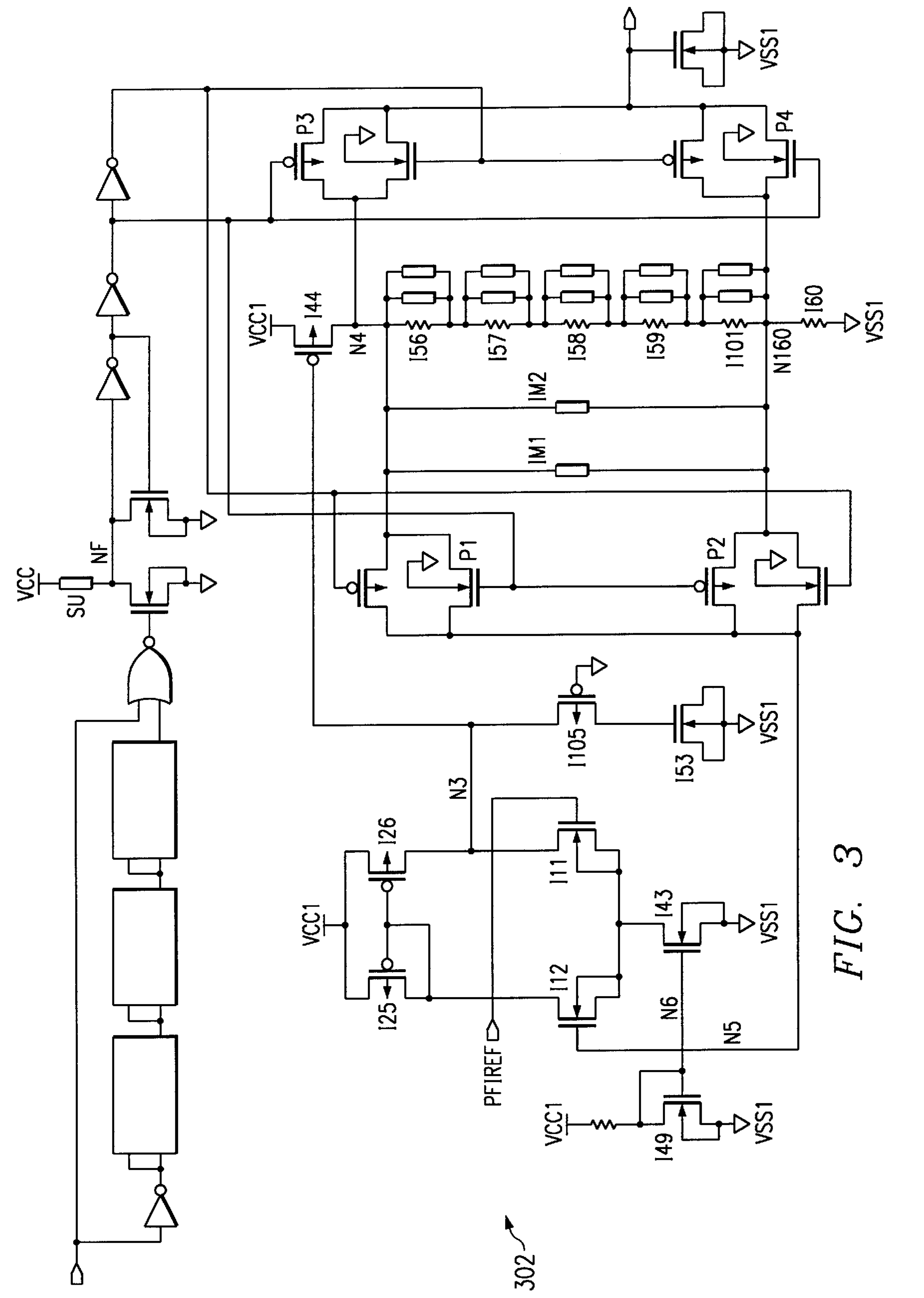
FIG. 3 is a circuit diagram for a reference voltage adjustment (or "trim") circuit in accordance with a preferred embodiment of the present invention.

Referring to FIG. 3, a circuit diagram for a reference voltage adjustment (or "rim") circuit in accordance with a preferred embodiment of the present invention is illustrated. Trim circuit 302 provides trim up/down capability to allow operation within a tightly spaced window. The input of trim circuit 302 receives the reference voltage, which in the depicted example is the reference voltage PFIREF from the output of the circuit depicted in FIG. 2. However, trim circuit 302 may be employed with any reference voltage, no matter how generated.

Trim circuit 302 includes a voltage follower circuit, which is equivalent to an operational amplifier with the output connected for unitary feedback to the negative input. The input reference voltage PFIREF is tied to one n-channel transistor I11 of a current mirror differential amplifier including n-channel transistors I11 and I12 and p-channel transistors I25 and I26. The output of the current mirror differential amplifier, node N3, controls p-channel transistor 144. Transistor I44 has a resistor I60 connected between the drain and the lower power supply voltage VSS1.

Two sets of pass gates P3 and P4 are connected between the output OUT and nodes N4 and N160, respectively, and select either node N4 or node N160 to be connected to the output OUT. Two additional sets of pass gates P1 and P2 are connected between node N5 and nodes N4 and N160, respectively, and select either node N4 or node N160 to be connected to node N5. Node N5 is the other input to the current mirror differential amplifier, tied to the gate of transistor I12. The voltage follower includes the current mirror differential amplifier and transistor I44 with its resistive load to ground. The current mirror differential amplifier and transistor I44 with its resistive load will regulate node N5 to be equal to the voltage at the input PFIREF. This is the stable point of operation; if the voltage at node N5 ever varies from the input voltage value PFIREF, the voltage will be driven back so that if the input PFIREF is 1.25 V then the voltage at node N5 will also be 1.25 V.

Trim capability is provided within trim circuit I44 by resistive loads I56, I57, I58, I59, and I101 serially connected at the output of the voltage follower between the source of transistor I44 (node N4) and resistive load I60 (node N160). Each resistive load I56, I57, I58, I59, and I101 is shunted by a corresponding pair of fuses, and the entire series of resistive loads is shunted by a pair of master fuses IM1 and IM2. The resistive loads I56, I57, I58, I59, and I101 have resistance values which provide a voltage drop or adjustment of 10 mV, 20 mV, 40 mV, 80 mV and 160 mV, respectively, and may be utilized in any combination. To trim the reference voltage, at least master fuses IM1 and IM2 must be blown; simply blowing master fuses IM1 and IM2 provides a voltage shift of 5 mV. Additional voltage shift is provide by blowing the fuse pairs shunting selected resistive loads I56, I57, I58, I59, and I101 to add additional resistance between nodes N4 and N160. For example, if a voltage shift of 35 mV is required, master fuses IM1 and IM2 should be blown together with the fuses shunting resistive loads I56 and I57. The fuses shunting resistive loads I58, I59, and I101 are left intact. Similarly, if a voltage shift of 95 mV is required, the master fuses IM1 and IM2 and the fuses shunting resistive loads I56 and I59 should be blown, leaving the fuses shunting resistive loads I57, I58, and I101 intact. This provides a total trim range of ±5, 15, 25 . . . 315 mV.

The reference voltage PFIREF is decremented by trim circuit 302 by leaving fuse SU connected between the upper power supply VCC and node NF intact. In that circumstance, passgates P1 and P4 will be on, while the other two passgates P2 and P3 will be off so that node N4 is connected to node N5, the second input of the current mirror differential amplifier, and node N160 is connected to the output OUT of trim circuit 302. Node N4 is at the input reference voltage level, nominally 1.25 V in the exemplary embodiment. Node N160 is shorted to node N4 when all fuses are intact. Fuses are selectively blown to provide downward trim. When master fuses IM1 and IM2 are blown, the output voltage OUT is decreased by 5 mV. Additional decreases to the output voltage OUT are achieved by blowing the fuses shunting whichever resistive loads I56, I57, I58, I59, and I101 combine with the 5 mV initial drop to achieve the desired voltage adjustment. For instance, an output voltage of 1.295 V may be trimmed to the desired 1.25 V by blowing the master fuses IM1 and IM2 and the fuses shunting resistive load I58.

The reference voltage PFIREF is incremented by trim circuit 302 by blowing fuse SU to turn off passgates P1 and P4 and turn on passgates P2 and P3. Node N160 in thus connected to node N5 and the second input to the current mirror differential amplifier, while node N4 is connected to the output OUT. With all other fuses left intact, node N4 is shorted to node N160. Blowing master fuses IM1 and IM2 will provide upward trim of 5 mV to the output of the voltage follower, and therefore to the reference voltage. Additional fuses across resistive loads I56,157,158,159, and I101 may be blown to achieve additional upward trim in the same manner described above with respect to downward trim. As a result, the voltage level at the output OUT may be selectively shifted up in predefined increments.

Two master fuses IM1 and IM2 are provided across the entire series of fuseable resistive loads between nodes N4 and N160, and fuse pairs are employed across each individual resistive load I56, I57, I58, I59, and I101, to lower the resistance across nodes N4 and N160 as much as possible before any fuses are blown. A current source I49 (and node N6) may be implemented within the trim circuit 302 to make the circuit self contained, or a current source from another circuit may be employed. Transistors I105 and I53 may be added for stability for AC analysis.

The reference voltage trim circuit of the present invention provides trim up and trim down capability to an reference or bias voltage without affecting the reference or bias voltage itself, and without unduly compromising the reference or bias voltage. The trim circuit may be employed with any type of reference or bias voltage. Simulations show no variation over process, voltage, or temperature.

While the invention has been particularly shown and described with reference to a preferred embodiment, it will be understood by those skilled in the art that various changes in form and detail may be made therein without departing from the spirit and scope of the invention.

What is claimed is:

1. A reference voltage circuit, comprising:

an input terminal receiving an input voltage differing from an upper power supply voltage by a desired reference voltage;

a first current mirror coupled at an input thereof to the input terminal;

a first load device and a first transistor connecting the input of the first current mirror to a ground voltage;

a second current mirror coupled at an input thereof to an output of the first current mirror; and a second load device and a second transistor connecting an output of the second current mirror to a power supply voltage, wherein threshold voltages for the first and second transistors are matched and resistances for the first and second load devices are matched.

2. The reference voltage circuit of claim 1, wherein the first current mirror further comprises:

first and second p-channel transistors connected to each other at drains and gates thereof and connected at the drains to the power supply voltage, a source of the first p-channel transistor connected to the gate thereof and coupled to the first load device, a source of the second p-channel transistor serving as the output for the first current mirror.

3. The reference voltage circuit of claim 2, wherein the second current mirror further comprises:

first and second n-channel transistors connected to each other at drains and gates thereof and connected at the drains to the ground voltage, a source of the first n-channel transistor connected to the gate thereof and coupled to the output of the first current mirror, a source of the second p-channel transistor producing the output voltage.

4. The reference voltage circuit of claim 1, wherein the desired reference voltage is produced at the output of the second current mirror.

5. The reference voltage circuit of claim 1, wherein the first transistor receives the input voltage at a gate thereof.

6. The reference voltage circuit of claim 3, wherein the first load device is connected between a drain of the first transistor and the ground voltage, and wherein the first transistor is connected at a source thereof to the input of the first current mirror, the input of the first current mirror formed by the source of the first p-channel transistor within the first current mirror.

7. The reference voltage circuit of claim 3, wherein the second load device is connected between a drain of the second transistor and the output of the second current mirror, wherein the output of the second current mirror is formed by the source of the second n-channel transistor within the second current mirror, and wherein the second transistor is connected at a source thereof to the power supply voltage.

8. The reference voltage circuit of claim 1, further comprising:

a transistor coupled between the output of the first current mirror and the input of the second current mirror to approximately match voltages at sources of the first and second p-channel transistors within the first current mirror.

9. A method of generating a reference voltage, comprising:

receiving an input voltage differing from an upper power supply voltage by a desired reference voltage at an input terminal;

mirroring an input current proportional to the input voltage using a first current mirror coupled at an input thereof to the input terminal, wherein the input current passes through a first load device and a first transistor connecting the input of the first current mirror to a ground voltage; and mirroring an output current from the first current mirror using a second current mirror coupled at an input thereof to an output of the first current mirror, wherein an output current from the second current mirror passes through a second load device and a second transistor connecting an output of the second current mirror to a power supply voltage, wherein threshold voltages for the first and second transistors are matched and resistances for the first and second load devices are matched.

10. The method of claim 9, wherein the step of mirroring an input current proportional to the input voltage using a first current mirror coupled at an input thereof to the input terminal further comprises:

using a current mirror including first and second p-channel transistors connected to each other at drains and gates thereof and connected at the drains to the power supply voltage, a source of the first p-channel transistor connected to the gate thereof and coupled to the first load device, a source of the second p-channel transistor serving as the output for the first current mirror.

11. The method of claim 10, wherein the step of mirroring an output current from the first current mirror using a second current mirror coupled at an input thereof to an output of the first current mirror further comprises:

using a current mirror including first and second n-channel transistors connected to each other at drains and gates thereof and connected at the drains to the ground voltage, a source of the first n-channel transistor connected to the gate thereof and coupled to the output of the first current mirror, a source of the second p-channel transistor producing the output voltage.

12. The method of claim 9, further comprising:

producing the desired reference voltage at the output of the second current mirror.

13. The method of claim 9, further comprising:

receiving the input voltage at a gate of the first transistor.

14. The method of claim 11, wherein the first load device is connected between a drain of the first transistor and the ground voltage, and wherein the first transistor is connected at a source thereof to the input of the first current mirror, the input of the first current mirror formed by the source of the first p-channel transistor within the first current mirror.

15. The method of claim 11, wherein the second load device is connected between a drain of the second transistor and the output of the second current mirror, wherein the output of the second current mirror is formed by the source of the second n-channel transistor within the second current mirror, and wherein the second transistor is connected at a source thereof to the power supply voltage.

16. The method of claim 11, further comprising:

approximately matching voltages at sources of the first and second p-channel transistors within the first current mirror.

17. A reference voltage circuit, comprising:

an input terminal receiving an input voltage differing from a power supply voltage by a desired reference voltage;

a first transistor connected at a gate thereof to the input terminal and at a drain thereof through a first resistor to a ground voltage;

a first current mirror including first and second p-channel transistors connected to each other at gates and drains thereof and connected at the drains to the power supply voltage, the first p-channel transistor connected at the gate thereof to sources of the first p-channel transistor and the first transistor, wherein the source of the first p-channel transistor forms an input of the first current mirror an a source of the second p-channel transistor forms an output for the first current mirror;

a second current mirror including first and second n-channel transistors connected to each other at drains thereof and connected at the drains to the ground voltage, the first n-channel transistor connected at a source thereof to gates of the first and second n-channel transistors, wherein the source of the first n-channel transistor forms an input for the second current mirror and a source of the second n-channel transistor forms an output for the second current mirror, the second current mirror coupled at an input thereof to the output for the first current mirror;

a second transistor connected at a drain thereof through a second resistor to the output of the second current mirror, a drain of the second transistor connected to a gate thereof and to the power supply voltage; and an output terminal connected to the output of the second current mirror, wherein threshold voltages for the first and second transistors are matched and resistances for the first and second resistors are matched.

18. The reference voltage circuit of claim 17, wherein the desired reference voltage is produced at the output terminal.

19. The reference voltage circuit of claim 17, further comprising:

a third transistor connected between the output of the first current mirror and the input of the second current mirror, wherein voltages at sources of the first and second p-channel transistors are approximately matched.

20. The reference voltage circuit of claim 19, wherein the third transistor is connected at a source thereof to a gate thereof and to the source of the second p-channel transistor, and at a drain thereof to the source of the first n-channel transistor.

* * * * *